United States Patent [19]
Pedersen

[11] Patent Number: 5,835,998
[45] Date of Patent: Nov. 10, 1998

[54] LOGIC CELL FOR PROGRAMMABLE LOGIC DEVICES

[75] Inventor: Bruce B. Pedersen, San Jose, Calif.

[73] Assignee: Altera Corporation, San Jose, Calif.

[21] Appl. No.: 727,921

[22] Filed: Oct. 9, 1996

Related U.S. Application Data

[60] Provisional application No. 60/014,621, Apr. 4, 1996.
[51] Int. Cl.$^6$ .................................................. H03K 17/177
[52] U.S. Cl. .................................................. 326/40; 326/41
[58] Field of Search ................................. 326/38, 39, 40, 326/41, 93

[56] References Cited

U.S. PATENT DOCUMENTS

| | | | |
|---|---|---|---|
| Re. 34,363 | 8/1993 | Freeman | 307/465 |
| 3,473,160 | 10/1969 | Wahlstrom | 340/172.5 |
| 4,609,986 | 9/1986 | Hartmann et al. | 364/200 |
| 4,617,479 | 10/1986 | Hartmann et al. | 307/465 |
| 4,642,487 | 2/1987 | Carter | 307/465 |
| 4,677,318 | 6/1987 | Veenstra | 307/465 |
| 4,713,792 | 12/1987 | Hartmann et al. | 364/900 |
| 4,758,745 | 7/1988 | Elgamal et al. | 307/465 |
| 4,774,421 | 9/1988 | Hartmann et al. | 307/465 |
| 4,871,930 | 10/1989 | Wong et al. | 307/465 |
| 4,899,067 | 2/1990 | So et al. | 307/465 |
| 4,912,342 | 3/1990 | Wong et al. | 307/465 |
| 5,023,606 | 6/1991 | Kaplinsky | 340/825.8 |
| 5,073,729 | 12/1991 | Greene et l. | 307/465.1 |
| 5,121,006 | 6/1992 | Pedersen | 307/465 |
| 5,122,685 | 6/1992 | Chan et al. | 307/465.1 |
| 5,132,571 | 7/1992 | McCollum et al. | 307/465.1 |
| 5,144,166 | 9/1992 | Camarota et al. | 307/465.1 |
| 5,208,491 | 5/1993 | Ebeling et al. | 307/465 |
| 5,218,240 | 6/1993 | Camarota et al. | 307/443 |
| 5,220,214 | 6/1993 | Pedersen | 307/465 |
| 5,225,719 | 7/1993 | Agrawal et al. | 307/465 |

(List continued on next page.)

FOREIGN PATENT DOCUMENTS

| | | | |
|---|---|---|---|
| 463746 A2 | 1/1992 | European Pat. Off. | G06F 15/60 |
| 630115 A2 | 12/1994 | European Pat. Off. | H03K 19/177 |
| WO 95/04404 | 2/1995 | WIPO | H03K 19/177 |
| WO 95/22205 | 8/1995 | WIPO | H03K 19/177 |

OTHER PUBLICATIONS

R. C. Minnick, "A Survey of Microcellular Research," Journal of the Association for Computing Machinery, vol. 14, No. 2, pp. 203–241, Apr. 1967.

S. E. Wahlstrom, "Programmable Logic Arrays—Cheaper by the Millions," Electronics, Dec. 11, 1967, pp. 90–95.

*Recent Developments in Switching Theory*, A. Mukhopadhyay, ed., Academic Press, New York, 1971, chapters VI and IX, pp. 229–254 and 369–422.

*The Programmable Gate Array Data Book*, 1988, Xilinx, Inc., San Jose, CA.

(List continued on next page.)

*Primary Examiner*—Jon Santamauro
*Assistant Examiner*—Don Phu Le
*Attorney, Agent, or Firm*—Fish & Neave; Robert R. Jackson

[57] ABSTRACT

A programmable logic array integrated circuit has a plurality of regions of programmable logic. Each region includes a plurality of logic modules, each of which is programmable to perform any of several logic functions on input signals applied to the module. Each module also includes a register for selectively registering a signal produced in or applied to the logic module. Signals for controlling the register and possibly other functions of the module are selected on a region-wide basis to reduce the amount of architecture control memory that each region must have. Each register may be operated as either a flip-flop or a flow-through latch. The modules may be interconnected in a carry chain. The main output of a first module in such a chain may be fed back to the carry in input of that module to avoid having to use another module to generate a carry in signal for the first module in the chain.

13 Claims, 5 Drawing Sheets

U.S. PATENT DOCUMENTS

| | | | |
|---|---|---|---|
| 5,255,203 | 10/1993 | Agrawal et al. | 364/489 |
| 5,258,668 | 11/1993 | Cliff et al. | 307/465 |
| 5,260,610 | 11/1993 | Pedersen et al. | 307/465 |
| 5,260,611 | 11/1993 | Cliff et al. | 326/39 |
| 5,274,581 | 12/1993 | Cliff et al. | 364/784 |
| 5,338,984 | 8/1994 | Sutherland | 307/465.1 |
| 5,350,954 | 9/1994 | Patel | 307/465 |
| 5,371,422 | 12/1994 | Patel et al. | 326/41 |
| 5,448,186 | 9/1995 | Kawata | 326/41 |
| 5,459,421 | 10/1995 | Shaw | 327/203 |
| 5,467,029 | 11/1995 | Taffe et al. | 326/41 |
| 5,469,003 | 11/1995 | Kean | 326/39 |
| 5,483,178 | 1/1996 | Costello et al. | 326/41 |
| 5,509,128 | 4/1996 | Chan | 395/311 |
| 5,546,018 | 8/1996 | New et al. | 326/38 |
| 5,623,217 | 4/1997 | Britton et al. | 326/40 |
| 5,652,529 | 7/1997 | Gould et al. | 326/93 |

OTHER PUBLICATIONS

El Gamal et al., "An Architecture for Electrically Configurable Gate Arrays," IEEE Journal of Solid–State Circuits, vol. 24, No. 2, Apr. 1989, pp. 394–398.

El–Ayat et al., "A CMOS Electrically Configurable Gate Array," IEEE Journal of Solid–State Circuits, vol. 24, No. 3, Jun. 1989, pp. 752–762.

*ACT Family Field Programmable Gate Array Databook*, Apr. 1992, Actel Corporation, Sunnyvale, CA, pp. 1–35 through 1–44.

*The Programmable Logic Data Book*, 1994 Xilinx, Inc., San Jose, CA, pp. 2–7, 2–12, and 2–13.

"XC5000 Logic Cell Array Family, Technical Data, Advance Information," Xilinx, Inc., Feb. 1995.

"Optimized Reconfigurable Cell Array ORCA OR2CxxA Series Field–Programmable Gate Arrays", Lucent Technologies, Microelectronics Product Brief, PN96–021FPGA, May 1996.

"Optimized Reconfigurable Cell Array ORCA OR2TxA Series Field–Programmable Gate Arrays", Lucent Technologies, Microelectronics Product Brief, PN96–022FPGA, May 1996.

| | | | | | | | | | | |
|---|---|---|---|---|---|---|---|---|---|---|
| INPUTS | ASYNC CLEAR | 1 | 0 | 0 | 0 | 0 | 0 | 0 | 0 | 0 |
| | ASYNC LOAD | X | 1 | 0 | 0 | 0 | 0 | 0 | 0 | 0 |
| | CLOCK ENABLE | X | X | 0 | 1 | 1 | 1 | 1 | 1 | 1 |
| | SYNC CLEAR | X | X | X | 1 | 0 | 0 | 0 | 0 | 0 |
| | SYNC LOAD | X | X | X | X | 1 | 0 | 0 | 0 | 0 |
| | COUNT ENABLE | X | X | X | X | X | 0 | 1 | X | 1 |
| | R_LATCH | X | X | X | 0 | 0 | 0 | 0 | 1 | 0 |
| | R_PACKED_REG | X | X | X | 0 | 0 | 0 | 0 | 0 | 1 |
| OUTPUTS | CLEAR | 1 | 0 | 0 | 1 | 0 | 0 | 0 | 0 | 0 |
| | LOAD | 0 | 1 | 0 | 0 | 1 | 0 | 0 | 0 | 1 |
| | DISABLE | 0 | 0 | 1 | 0 | 0 | 1 | 0 | 0 | 0 |
| | NORMAL | 0 | 0 | 0 | 0 | 0 | 0 | 1 | 1 | 0 |
| | MASTER | 1 | 1 | $\bar{c}$ | $\bar{c}$ | $\bar{c}$ | $\bar{c}$ | $\bar{c}$ | 1 | $\bar{c}$ |
| | SLAVE | 1 | 1 | c | c | c | c | c | c | c |

FIG. 3

LOGIC CELL FOR PROGRAMMABLE LOGIC DEVICES

This application claims the benefit of U.S. provisional application No. 60/014,621, filed Apr. 4, 1996.

BACKGROUND OF THE INVENTION

This invention relates to programmable logic array integrated circuit devices, and more particularly to improved logic cells for such devices.

Programmable logic array integrated circuit devices are well known, as is shown, for example, by Cliff et al. U.S. Pat. 5,260,611 and Cliff et al. U.S. Pat. No. 5,689,195. (Both of these documents are hereby incorporated by reference herein.) A typical device of this kind has a plurality of regions of programmable logic disposed on the device in a two-dimensional array of intersecting rows and columns of such regions. Each region (sometimes referred to as a logic array block or "LAB") includes a plurality of modules of programmable logic. Each logic module is programmable to perform any of several elementary logic functions on a plurality of inputs applied to the logic module. For example, these logic functions may include forming any logical combination of the inputs, and either registering or not registering the result to produce an output signal of the logic module.

In order to perform more complex logic functions than the logic modules can perform individually, a network of interconnection conductors is provided on the device. For example, a plurality of "horizontal" conductors may extend adjacent to each "row" of LABs, and a plurality of "vertical" conductors may extend adjacent to each "column" of LABs. A plurality of local conductors may be associated with each LAB for (1) bringing signals from the adjacent horizontal and vertical conductors into the LAB, and (2) connecting the outputs of the logic modules in the LAB to logic module inputs of the LAB. The logic module outputs of the LAB may also be connected to the horizontal and/or vertical conductors that are adjacent to the LAB. Interconnections may also be made between horizontal and vertical conductors. Most or all of the conductor connections mentioned above may be programmable. In addition to allowing virtually any desired interconnections to be made between logic modules, the various conductors described above may also be used to bring external signals into the device and to convey output signals of the device to external circuitry.

The general-purpose interconnection network may be supplemented by special-purpose interconnections between adjacent or nearby logic modules. For example, to facilitate providing wide fan-in logic functions, each logic module may have a "cascade in" input which it receives directly from a "cascade out" output of an adjacent or nearby logic module. Each logic module can logically combine the signal that results from its normal combinatorial operation with its cascade in input to provide a cascade out signal. The direct cascade connections between logic modules speed the performance of wide fan-in functions.

Each logic module may be adapted to perform one place of binary addition, and to therefore produce a "carry out" signal as a secondary output signal in addition to a "sum out" signal which is the primary output of the logic module. The carry out signal of each logic module may be applied directly to a "carry in" input of an adjacent or nearby logic module. Again, these direct connections between logic modules speed the operation of a carry chain.

Logic modules may be adapted to act as various types of registers and counters (e.g., synchronous or asynchronous registers, or up or down counters, clearable counters, loadable counters, etc.).

Some prior programmable logic array devices have had extremely flexible logic modules with all of the above features programmably selectable on a logic-module-by-logic-module basis. This requires a substantial number of programmable "architecture" memory bits for each logic module. This in turn increases the overall memory requirements of the device.

In view of the foregoing, it is an object of the present invention to reduce the architecture memory requirements of programmable logic array integrated circuit devices.

It is a more particular object of this invention to provide logic modules and groups of logic modules (so-called regions or LABs) for programmable logic array integrated circuit devices which have considerable flexibility of use but which have reduced architecture memory requirements.

It is another more general object of this invention to provide improved logic modules and regions or LABs for programmable logic array integrated circuit devices.

SUMMARY OF THE INVENTION

These and other objects of the invention are accomplished in accordance with the principles of the invention by providing programmable logic array integrated circuits having a plurality of regions (sometimes referred to as LABs) of programmable logic. Each region includes a plurality of logic modules, each of which is programmable to perform any of a plurality logic functions on input signals applied to the module. Each module also includes a register for selectively registering a signal produced by or applied to the module. Each module can preferably produce both a main output signal and a carry out signal. The inputs of each module preferably include a carry in signal, which is the carry out signal of another module.

Instead of providing each module with memory elements for controlling the selection of the register-control signals that control the register in that module, these register-control signal selections are now made on a region-wide (LAB-wide) basis for all the modules in each region (LAB). For example, the region-wide register-control signal selections may include selecting signals for clocking, clearing, loading, and disabling the registers, as well as routing various module signals to the registers. Other functions of the modules may be controlled on a similar region-wide (LAB-wide) basis. For example, a single memory element may be used to place all of the modules in a region in counter mode, and another single memory element may be used to enable the carry in inputs of all of the modules in a region.

In accordance with another aspect of the invention, each register is made up of two, separately clockable, flow-through latches connected in series. If the two latches are clocked by clock signals with an appropriate phase shift, the register functions as a flip-flop. If the clock signal of the first latch is held constant at an appropriate level, while the second latch continues to be clocked by a cyclic clock signal, the register functions as a flow-through latch.

In accordance with still another aspect of the invention, the main output of selected modules can be used as the carry in inputs to those modules. A module for which this is done can better function as the first module in a carry chain because another module does not have to be used to provide the first module's carry in input and because that input is not delayed by having to come from the logic of the other module.

Further features of the invention, its nature and various advantages will be more apparent from the accompanying drawings and the following detailed description of the preferred embodiments.

BRIEF DESCRIPTION OF THE DRAWINGS

FIG. 3 is a table showing illustrative logic performed by a portion of the FIG. 2 apparatus.

DETAILED DESCRIPTION OF THE PREFERRED EMBODIMENT

The logic modules and groups of logic modules (regions or LABs) of this invention may be used in programmable logic array integrated circuit devices of the type shown in Cliff et al. U.S. patent application Ser. No. 08/672,676, filed Jun. 28, 1996, which is hereby incorporated by reference herein. Such use of the present invention is, however, only illustrative, and the invention may be alternatively used in other types of devices.

Figure 1:
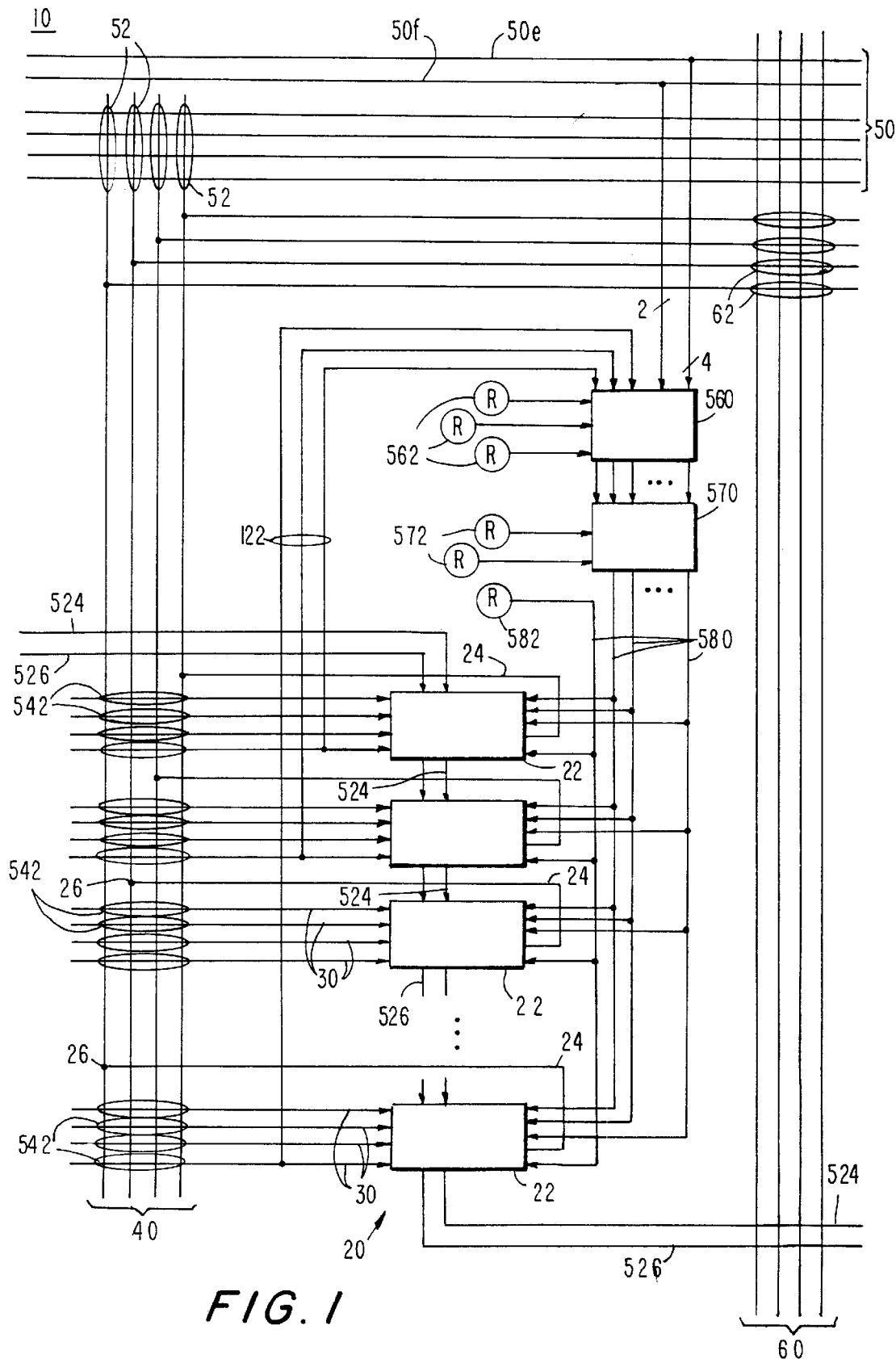
FIG. 1 is a simplified schematic block diagram of a representative portion of an illustrative embodiment of a programmable logic array integrated circuit constructed in accordance with this invention.

An illustrative region or LAB 20 constructed in accordance with this invention is shown in FIG. 1 in a representative portion of a typical programmable logic array integrated circuit device 10. Device 10 is depicted as having the general type of organization of the just-mentioned Cliff et al. apparatus, although some elements and connections have been omitted from FIG. 1 in the interest of clarity and simplicity, while other elements and connections have been added to illustrate the present invention and to generalize some aspects of the device architecture. It should especially be noted that in many cases FIG. 1 only shows a few representative conductors of various types, and that more such conductors of these types are generally provided. For convenience in relating this specification to the just-mentioned Cliff et al. specification, the same reference numbers are generally used for the same or similar elements in both specifications.

The depicted LAB 20 is adjacent the intersection of horizontal conductors 50 and vertical conductors 60. Horizontal conductors 50 include some so-called "fast" signal lines 50e and some clock signal lines 50f. (Unlike other conductors 50 which extend only along one adjacent row of LABs 20, conductors 50e and 50f may extend adjacent to all LABs on device 10.) Local conductors 40 are associated with LAB 20 for such purposes as (1) bringing signals from conductors 50 and 60 into the LAB, (2) allowing the output signal(s) of each logic module 22 in the LAB to be made available as inputs to the logic modules in the LAB, and (3) allowing those same logic module output signals to be conveyed away from the LAB via conductors 50 and 60. Programmable logic connectors ("PLCs") 52 are provided for selectively bi-directionally interconnecting conductors 40 and 50. PLCs 62 are similarly provided for selectively bi-directionally interconnecting conductors 40 and 60. PLCs 542 are provided for selectively applying signals on local conductors 40 to the primary inputs 30 of logic modules 22. The primary output(s) 24 of each logic module is (or are) selectively applied to local conductors 40 by PLCs 26. Each logic module 22 can receive a cascade input signal 524 from an adjacent or nearby logic module and can produce a cascade output signal (also identified by the reference number 524) which is applied to another adjacent or nearby logic module. Similarly, each logic module 22 can receive a carry in input signal 526 from an adjacent or nearby logic module and can produce a carry out output signal 526 which is applied to another adjacent or nearby logic module.

In addition to the above-described data signals, each logic module 22 requires a plurality of control signals, some of which are shown entering the logic modules via leads 580. Some of these control signals control the "architecture" of the logic module (e.g., whether the logic module will act as an adder stage or a counter stage). Others of these signals control certain operations of the logic module (e.g., clocking the register in the logic module, clearing that register, etc.).

In accordance with the present invention the logic module control signals are provided on a LAB-wide basis to the greatest extent that is consistent with a practical and still reasonably flexible design. (Terms like "LAB" and "LAB-wide" are used herein as convenient short-hand terms for a plurality of logic modules. The terms "region", "region-wide", and the like are used herein with a similar meaning. A "LAB" for present purposes, however, is not necessarily a LAB for all purposes. For example, a "LAB" for present purposes may be only a fraction of the logic modules served by a group of local conductors 40. If local conductors 40 extend past eight logic modules 22, a LAB for present purposes may be all eight of those logic modules, or each of two groups of four of those modules, or each of two groups of three and five of those modules, etc.) In FIG. 1 the logic module control signals that are provided on a LAB-wide basis are those provided via leads 580. Some of these LAB-wide control signals may be derived substantially directly from programmable memory cells or function control elements ("FCEs") associated with the LAB. FCE 582 is an example of such an FCE. Others of these LAB-wide control signals 580 are produced by signal decoder 570. Decoder 570 decodes signals applied to it from signal selector 560 and FCEs 572. Selector 560 is controlled by FCEs 562 to select its various output signals from among its input signals 50e, 50f, and 122. Signals 122 are selected inputs 30 to selected ones of logic modules 22.

Figure 4:
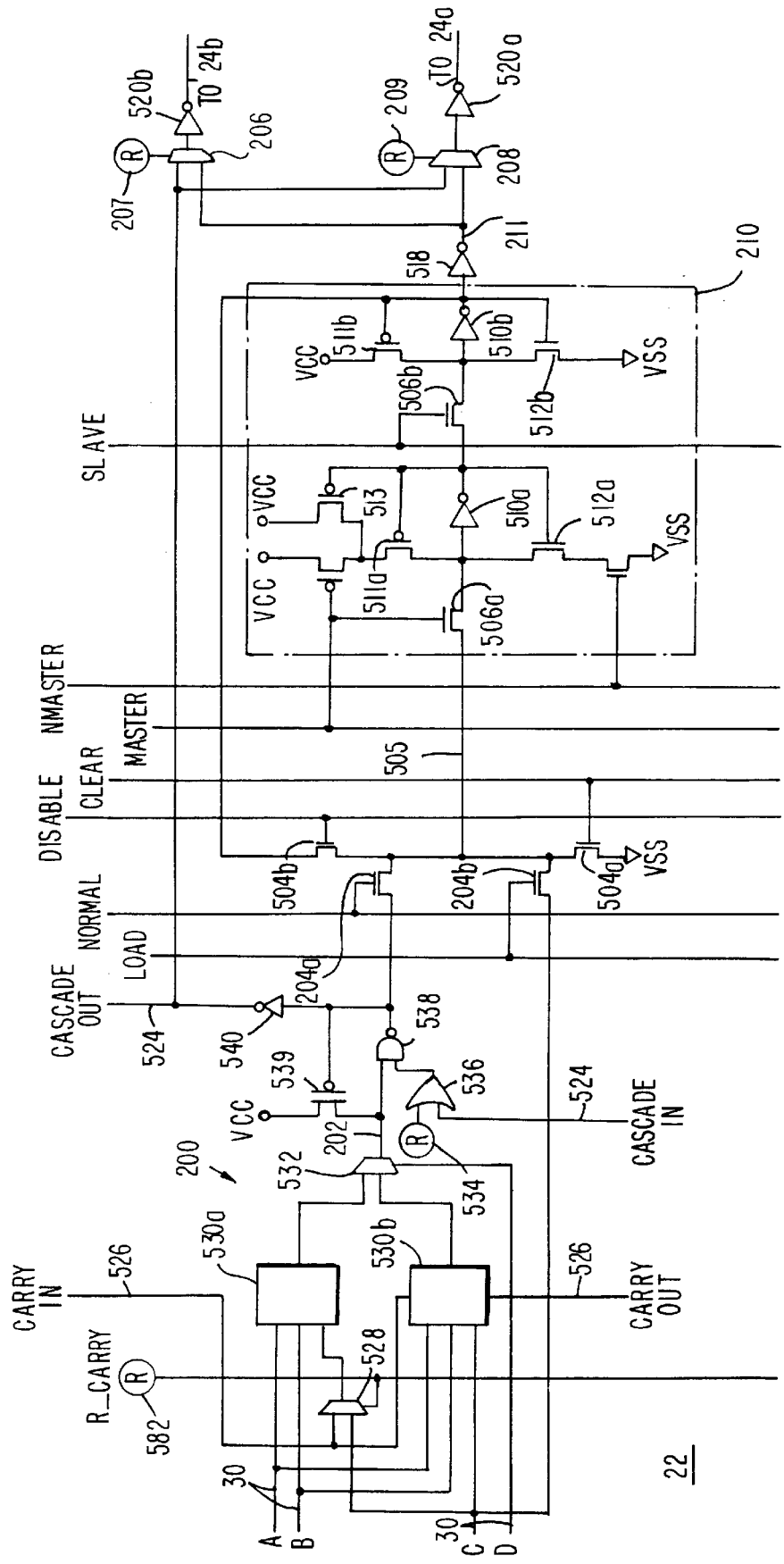
FIG. 4 is a simplified schematic block diagram showing another portion of FIG. 1 in more detail.

It should be mentioned that although most logic module control signals are now LAB-wide signals 580, some logic module control signals are still determined module by module. This will be more apparent when FIG. 4 is discussed below.

Figure 2:
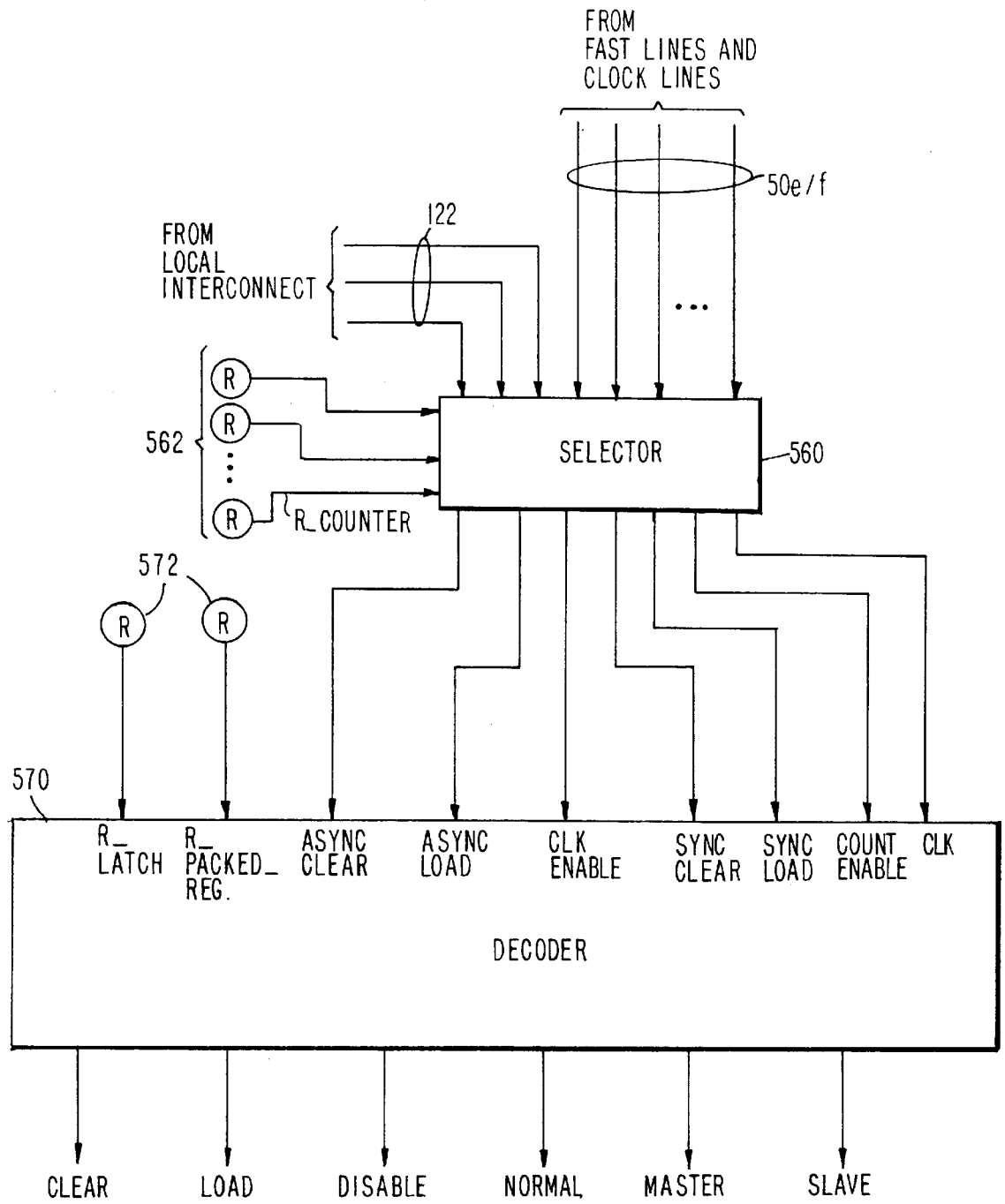
FIG. 2 is a more specific depiction of a portion of FIG. 1.

FIG. 2 shows an illustrative embodiment of elements 560 and 570 in more detail, and FIG. 3 shows the decoding performed by decoder 570 in the FIG. 2 embodiment of that element. In FIG. 3 "X" indicates a "don't care" input condition, "c" indicates a clock signal (identified as "CLK" in FIG. 2), and "c" with a bar over it indicates inversion of the clock signal.

Considering FIG. 2 now in more detail, under the control of FCEs 562, selector 560 selects from among its inputs 50e, 50f, and 122 the following signals: asynchronous clear ("ASYNC CLEAR"), asynchronous load ("ASYNC LOAD"), clock enable ("CLK ENABLE"), synchronous clear ("SYNC CLEAR"), synchronous load ("SYNC LOAD"), count enable ("COUNT ENABLE"), and clock ("CLK"; also called "c" in FIG. 3). For example, selector 560 may select CLK from the signal on either of the two universal clock lines 50f. As another example, selector 560 may select ASYNC CLEAR from the signal on any one of the four universal fast lines 50e. As still another example, if an R_COUNTER FCE 562 is programmed (logic 1), selector 560 selects leads 122 as the sources of the SYNC CLEAR, SYNC LOAD, and COUNT ENABLE signals as follows:

1. Bottom ("D") input lead of top logic module: SYNC CLEAR;
2. Bottom ("D") input lead of next logic module: SYNC LOAD; and
3. Bottom ("D") input lead of bottom logic module: COUNT ENABLE.

In the particular embodiment shown, the SYNC CLEAR, SYNC LOAD, and COUNT ENABLE signals are only meaningful when R_COUNTER is logic 1. Thus these counter-function-related signals always come from leads 122, thereby effectively "stealing" the D inputs from the three logic modules identified in the list which is immediately above. This stealing is acceptable because when counting, a logic module needs no more than two primary inputs 30 (i.e., feedback from its register and one place of a count interval value). On the other hand, selector 560 may typically select signals like ASYNC CLEAR, ASYNC LOAD, and CLOCK ENABLE from any of leads 50e and 122. The CLK signal is typically selected from any of leads 50f and 122. Other sets of choices are of course possible (e.g., selecting any of ASYNC CLEAR, ASYNC LOAD, CLOCK ENABLE, and CLK from any of leads 50e, 50f, and 112).

As shown in FIG. 3, when the eight input signals shown in the upper part of that FIG. have the values specified in a particular column, the six output signals of decoder 570 have the values shown in the lower part of that same column. For example, when the ASYNC CLEAR input to decoder 570 is logic 1, the decoder produces the following six output signal values: CLEAR=1, LOAD=0, DISABLE=0, NORMAL=0, MASTER=1, and SLAVE=1.

FIG. 4 shows in more detail an illustrative embodiment of a representative logic module 22 from FIG. 1. As shown in FIG. 4, logic module 22 includes a modified four-input look-up table 200. The modifications to a basic four-input look-up table are to enable one logic module to perform one place of binary arithmetic and to accordingly produce both a sum out digit (on lead 202) and a carry out digit (on lead 526). This is described in more detail in Cliff et al. U.S. Pat. No. 5,224,581, which is hereby incorporated by reference herein. Without going into all the detail provided in the last-mentioned patent, the four-input look-up table is divided into two three-input look-up tables 530a and 530b. Each of tables 530 is programmable to produce an output which is any logical combination of the three inputs applied to that table. Normally (when LAB-wide R_CARRY FCE 582 is programmed to be logic 0), the three inputs to each of tables 530 are the A, B, and C inputs 30 to the logic module. The fourth (D) input 30 to the logic module controls PLC 532 to select the output signal of one of tables 530 as the final output signal 202 of the look-up table structure.

On the other hand if LAB-wide R_CARRY FCE 582 is programmed logic 1 (to make it possible for each logic module 22 in the associated LAB 20 to perform a respective place of binary arithmetic), then PLC 528 selects the carry in signal on lead 526 as the third input to table 530a (in place of normal input C). In this case table 530a is programmed to produce an output signal which is the sum of the A, B, and carry in inputs, and input D is used to control PLC 532 to select the output of table 530a as the sum out output signal 202 of the logic module. At the same time, the carry in signal is used in table 530b to select the carry out signal on lead 526 from two combinations of the A and B inputs produced by table 530b. Thus when R_CARRY is logic 1, logic module 22 performs one place of binary arithmetic on its A and B inputs, producing both a sum out signal on lead 202 and a carry out signal on lead 526. In accordance with this invention, the selection of the arithmetic carry mode of operation is preferably made on a LAB-wide basis by one R_CARRY FCE 582 for each LAB.

Downstream from look-up table section 200, logic module 22 includes a cascade logic section, a principal component of which is NAND gate 538. If it is desired for logic module 22 to respond to a cascade input signal 524 (applied directly from the cascade out lead 524 of another nearby logic module), FCE 534 is programmed logic 0. FCE 534 is an example of an architecture feature which is preferably still controlled on a logic-module-by-logic-module basis in accordance with this invention. Therefore, as shown in FIG. 4, each logic module 22 preferably has its own separately programmable FCE 534. Programming FCE 534 logic 0 enables OR gate 536 to apply the cascade in signal it receives via lead 524 to NAND gate 538 for logical combination with look-up table output 202. (The feedback loop including transistor 539 is a level restoring circuit.) The output signal of NAND gate 538 is applied to cascade out lead 524 via inverter 540.

Downstream from the cascade logic section, the next section of logic module 22 controls whether the output of the cascade logic section or the C input to the logic module is applied to the register 210 of the logic module. The normal condition of the logic module is for the output of the cascade logic section to be applied to the register. This occurs when the NORMAL output signal of decoder 570 is logic 1, thereby enabling transistor 204a. Alternatively, when the LOAD output signal of decoder 570 is logic 1, transistor 204b is enabled to pass the logic module's C input. The LOAD signal is asserted when doing a synchronous or asynchronous loading of the register (as in a loadable counter operation) or when using the logic module in a packed register mode of operation (e.g., when using the logic module to produce both a combinatorial output (based on any or all of inputs A, B, and D) and a registered output (based on input C)). The packed register mode of operation (sometimes called the lonely register mode of operation) allows the register of the logic module to continue to perform some function if desired (i.e., by serving as a register for the C input of the logic module), while the remainder of the logic module is performing a separate combinatorial function. The packed register mode of operation is associated with the right-hand column in FIG. 3 (R_PACKED_REG FCE 572 programmed logic 1).

Downstream from the NORMAL/LOAD section is the CLEAR/DISABLE section. The NORMAL, LOAD, CLEAR, and DISABLE signals are mutually exclusive of one another. That is, only one of these signals can be asserted (logic 1) at any one time. When the CLEAR output signal of decoder 570 is logic 1, transistor 504a is enabled, thereby tying the data input of the logic module's register to VSS (logic 0). This will clear the register. On the other hand, when the DISABLE output signal of decoder 570 is logic 1, the data input of the register is tied to the register's data output. This prevents the register from changing state and thereby disables it.

The next section of the circuitry shown in FIG. 4 is the actual register 210 of the logic module. This circuitry has two modes of operation: (1) an edge-trigger mode and (2) a flow-through mode. The register circuitry basically comprises two flow-through latches connected in series. The left-hand latch (including forward inverter 510a) is sometimes referred to as the master stage, while the right-hand latch (including forward inverter 510b) is sometimes referred to as the slave stage. Transistors 511a and 512a comprise a weak reverse inverter from the output of inverter 510a back to its input, thereby creating the master latch. Transistors 511b and 512b similarly comprise a weak reverse inverter from the output of inverter 510b back to its input, thereby creating the slave latch. Transistor 513 is a level restorer for the output of inverter 510a.

In the edge-trigger mode of operation (e.g., third from right-hand column in FIG. 3), the MASTER signal is the inverse of the CLK signal applied to decoder 570, while NMASTER (the inverse of MASTER) and SLAVE are equal to the CLK signal. Accordingly, the master section of register 210 latches in the data signal on lead 505 in response to the rising edge of the CLK signal. The slave section also begins to output that same data signal at the same time, and the slave section latches in that data signal on the falling edge of the CLK signal. This provides conventional flip-flop operation of register 210.

In the flow-through mode of operation (second from right-hand column in FIG. 3; R_LATCH FCE 572 programmed logic 1), the MASTER signal is tied to VCC (by decoder 570). The NMASTER signal is therefore VSS. Decoder 570 continues to supply CLK as the SLAVE signal. With the MASTER signal tied to VCC, the master section merely passes through the data applied to it. The slave section continues to operate as a flow-through latch (as described above). This gives the overall register 210 the operating characteristics of a flow-through latch.

The final section of the circuitry shown in FIG. 4 is the output signal switching section. The output signal of register 210 is inverted by inverter 518 and then applied to one input of each of PLCs 206 and 208. The other input to each of PLCs 206 and 208 is the combinatorial output of NAND gate 538. Each of PLCs 206 and 208 is controlled by a respective FCE 207 or 209 to pass either of the applied signals. Thus either of the two outputs 24a and 24b of the logic module can be derived from either the registered or combinatorial signals of the logic module. (Above-mentioned application Ser. No. 08/672,676 shows how two outputs 24a and 24b from a logic module may be separately connected into the interconnection conductor network of the device.) FCEs 207 and 209 are preferably like cascade select FCE 534 in that they are separately provided for each logic module.

Returning now to further consider some of the input conditions shown in FIG. 3, it will be apparent that assertion of ASYNC CLEAR (first column in FIG. 3) immediately clears register 210. Assertion of ASYNC LOAD (second column in FIG. 3) immediately loads register 210 with the data signal on lead 505. Assertion of SYNC CLEAR (fourth column in FIG. 3) clears register 210 on the next rising edge of the CLK signal. Assertion of SYNC LOAD (fifth column in FIG. 3) loads register 210 with the data signal on lead 505 on the next rising edge of the CLK signal. If the associated LAB 20 is configured as a counter (associated R_COUNTER FCE 562 is programmed logic 1, SYNC_CLEAR=0, AND SYNC_LOAD=0), the counter only counts up or down while COUNT ENABLE is asserted (seventh column in FIG. 3). (The direction of counting (i.e., whether up or down) is controlled by the programming of the look-up tables 200 in the LAB. The feedback path for feeding the contents of register 210 back to the inputs of the logic module for counting is through the local interconnect (24, 26, 40, 542, 30) of the LAB.) The CLOCK ENABLE signal controls the availability of the CLK signal for the synchronous clear, synchronous load, and counter operations. The last column in FIG. 3 represents the packed register or lonely register mode (R_PACKED_REG FCE 572 programmed logic 1).

Figure 5:
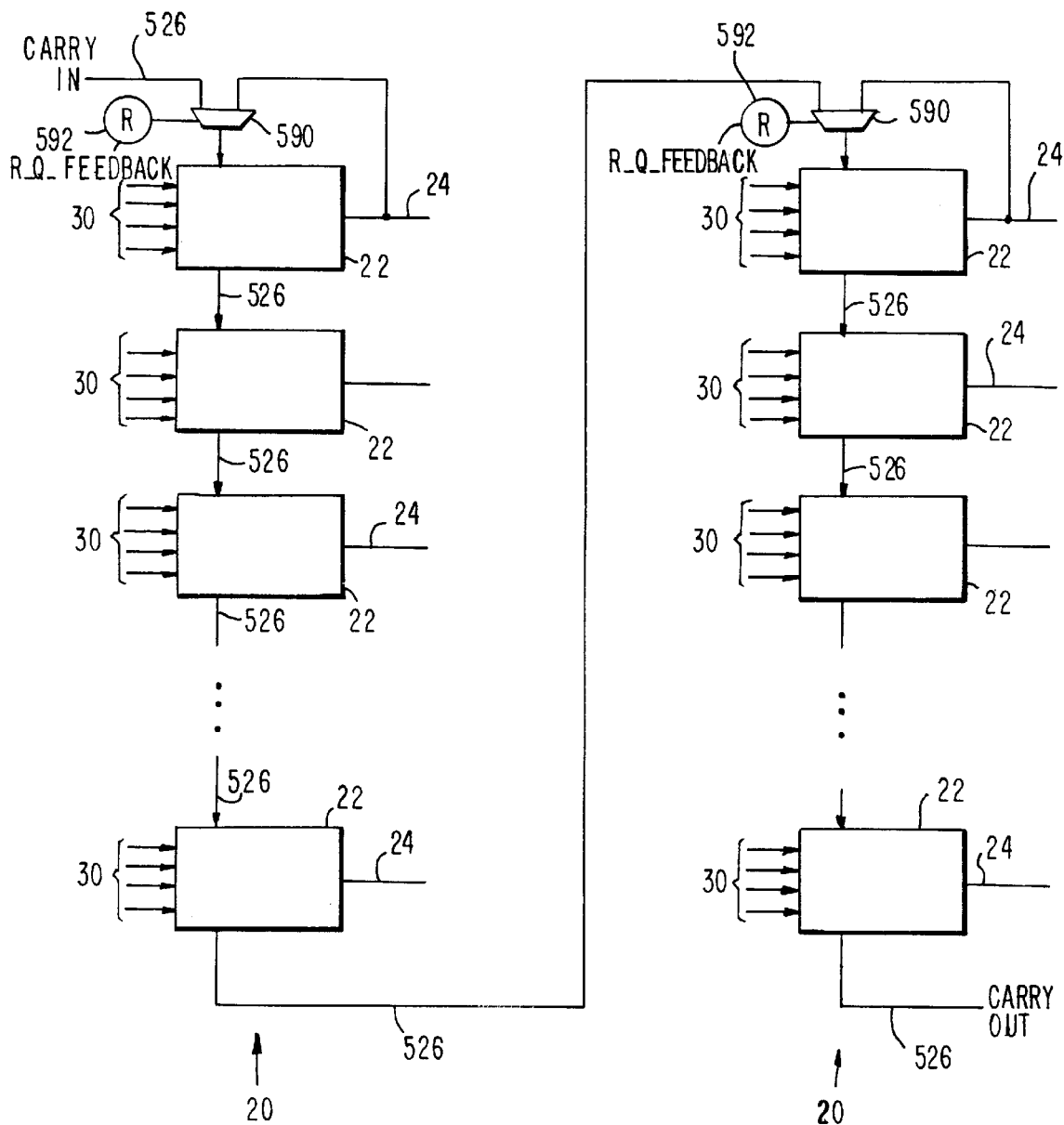
FIG. 5 is a simplified schematic block diagram showing another feature which can be provided in circuits of the type shown in FIG. 1 in accordance with this invention.

FIG. 5 illustrates a feature of the invention which allows the carry in signal of the first logic module 22 in each LAB 20 to be either the carry out signal from the last logic module in an adjacent or nearby LAB or the primary output 24 from that same first logic module. This selection is performed for each LAB by an associated PLC 590, which is controlled by an associated R_Q_FEEDBACK FCE 592. This feature allows the first logic module of any LAB to be used as the first stage of a counter without having to use another logic module to supply an artificial carry in signal to that first logic module. In addition to saving a logic module, this expedient increases counter speed because the carry in signal for the first logic module in the counter does not have to be generated by the look-up table 200 (or, more precisely, 530b) of another logic module.

The PLCs mentioned throughout this specification (which includes the appended claims) can be implemented in any of a wide variety of ways. For example, each PLC can be a relatively simple programmable connector such as a switch or a plurality of switches for connecting any one of several inputs to an output. Alternatively, each PLC can be a somewhat more complex element which is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc. As has been mentioned, the components of PLCs can be controlled by various, programmable, function control elements ("FCEs"), which are not always shown separately in the accompanying drawings. (With certain PLC implementations (e.g., fuses and metal optional links) separate FCE devices are not required, so that in those cases any depiction of FCE devices in the accompanying drawings merely indicates that the PLCs are programmable.) FCEs can also be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473,160), ferro-electric memories, fuses, antifuses, or the like. From the various examples mentioned above it will be seen that this invention is applicable both to one-time-only programmable and reprogrammable devices.

It will be understood that the foregoing is only illustrative of the principles of the invention and that various modifications can be made by those skilled in the art without departing from the scope and spirit of the invention. For example, the number of logic modules in a LAB can be varied if desired. Similarly, the number of inputs 30 to each logic module can be varied if desired, as can the numbers of any of the various kinds of interconnection conductors 40, 50, and 60. It will also be understood that terms like "row" and "column", "horizontal" and "vertical", "top" and "bottom", "left" and "right", and other similar directional or orientational characterizations are entirely arbitrary and are employed only as relative terms for convenience herein. These terms are not intended to have any absolute or fixed meaning or to limit the scope of the claims to any particular device orientations or directions.

The Invention claimed Is:

1. A programmable logic array integrated circuit comprising:

a plurality of regions of programmable logic, each of said regions including a plurality of modules of programmable logic, each of said modules including programmable logic circuitry for producing an intermediate signal which is any of a plurality of logical functions of a plurality of input signals applied to the module and a register for selectively registering a signal associated with the module, said register requiring the application of a clock-type signal in order to register said associated signal;

a plurality of sources of potential clock-type signals;

programmable function control elements associated with each of said regions; and signal selection circuitry associated with each of said regions and responsive to the function control elements associated with said region for selecting said clock-type signal to be used by all of said modules in the associated region from among said plurality of potential clock-type signals;

wherein each of said modules further includes circuitry for selectively disabling the register of said module in response to a disable-type signal, wherein said programmable logic array integrated circuit further comprises a plurality of sources of potential disable-control signals, and wherein said signal selection circuitry additionally derives said disable-type signal to be used by all of said modules in the associated region by selecting among said potential disable-control signals.

2. A programmable logic array integrated circuit comprising:

a plurality of regions of programmable logic, each of said regions including a plurality of modules of programmable logic, each of said modules including programmable logic circuitry for producing an intermediate signal which is any of a plurality of logical functions of a plurality of input signals applied to the module and a register for selectively registering a signal associated with the module, said register requiring the application of a clock-type signal in order to register said associated signal;

a plurality of sources of potential clock-type signals;

programmable function control elements associated with each of said regions; and signal selection circuitry associated with each of said regions and responsive to the function control elements associated with said region for selecting said clock-type signal to be used by all of said modules in the associated region from among said plurality of potential clock-type signals;

wherein each of said modules further includes circuitry for selectively applying said intermediate signal of said module to said register of said module for registering by said register in response to application of a normal-type signal, wherein said programmable logic array integrated circuit further comprises a plurality of sources of potential normal-control signals, and wherein said signal selection circuitry additionally derives said normal-type signal to be used by all of said modules in the associated region by selecting among said potential normal-control signals.

3. A programmable logic array integrated circuit comprising:

a plurality of regions of programmable logic, each of said regions including a plurality of modules of programmable logic, each of said modules including programmable logic circuitry for producing an intermediate signal which is any of a plurality of logical functions of a plurality of input signals applied to the module and a register for selectively registering a signal associated with the module, said register requiring the application of a clock-type signal in order to register said associated signal;

a plurality of sources of potential clock-type signals;

programmable function control elements associated with each of said regions; and signal selection circuitry associated with each of said regions and responsive to the function control elements associated with said region for selecting said clock-type signal to be used by all of said modules in the associated region from among said plurality of potential clock-type signals;

wherein each of said modules further includes circuitry for selectively applying an input signal of said module to said register for registering by said register in response to application of a load-type signal, wherein said programmable logic array integrated circuit further comprises a plurality of sources of potential load-control signals, and wherein said signal selection circuitry additionally derives said load-type signal to be used by all of said modules in the associated region by selecting among said potential load-control signals.

4. A programmable logic array integrated circuit comprising:

a plurality of regions of programmable logic, each of said regions including a plurality of modules of programmable logic, each of said modules including programmable logic circuitry for producing an intermediate signal which is any of a plurality of logical functions of a plurality of input signals applied to the module and a register for selectively registering a signal associated with the module, said register requiring the application of a clock-type signal in order to register said associated signal;

a plurality of sources of potential clock-type signals;

programmable function control elements associated with each of said regions; and signal selection circuitry associated with each of said regions and responsive to the function control elements associated with said region for selecting said clock-type signal to be used by all of said modules in the associated region from among said plurality of potential clock-type signals;

wherein in addition to said inputs each of said modules receives a carry in signal, wherein in addition to said intermediate output each of said modules produces a carry out signal which is the carry in signal to another module, wherein each of said modules includes carry selection circuitry for selectively substituting for one of the inputs of the module the carry in signal received by that module in response to application of a carry select signal, and wherein said programmable logic array integrated circuit further comprises:

a programmable carry select function control element associated with each of said regions for selectively applying a common carry select signal to all of the modules in said region.

5. A programmable logic array integrated circuit comprising:

a plurality of regions of programmable logic, each of said regions including a plurality of modules of programmable logic, each of said modules including programmable logic circuitry for producing an intermediate signal which is any of a plurality of logical functions of a plurality of input signals applied to the module and a register for selectively registering a signal associated with the module, said register requiring the application of a clock-type signal in order to register said associated signal;

a plurality of sources of potential clock-type signals;

programmable function control elements associated with each of said regions; and signal selection circuitry associated with each of said regions and responsive to the function control elements associated with said region for selecting said clock-type signal to be used by all of said modules in the associated region from among said plurality of potential clock-type signals;

wherein said register in each of said modules comprises:

first and second flow-through latch circuits connected in series and having respective first and second input gating transistors, said first and second input gating transistors being controlled by respective first and second clock-type signals applied by said signal selection circuitry associated with the region that includes the module, said signal selection circuitry being capable of producing said first and second clock-type signals independently of one another so that said first clock-type signal can either be (1) a phase-shifted version of said second clock-type signal so that said register operates as a flip-flop, or (2) held constant while said second clock-type signal continues to be cyclic so that said register operates as a flow-through latch.

6. A programmable logic array integrated circuit comprising:

a plurality of regions of programmable logic, each of said regions including a plurality of modules of programmable logic, each of said modules including programmable logic circuitry for producing an intermediate signal which is any of a plurality of logical functions of a plurality of input signals applied to the module and a register for selectively registering a signal associated with the module, said register having a function which is controlled by a register-control signal applied to said register;

a programmable counter selection function control element associated with each of said regions for selectively indicating that the modules in the region are to be used to provide respective stages of a counter; and signal selection circuitry associated with each of said regions and responsive to the counter selection function control element of the region for selecting one of said input signals of one of the modules in the region as a source for the register-control signal applied to the registers of all of the modules in the region.

7. The apparatus defined in claim 6 wherein the function controlled by said register-control signal is clearing the register.

8. The apparatus defined in claim 6 wherein the function controlled by said register-control signal is loading the register.

9. The apparatus defined in claim 6 wherein the function controlled by said register-control signal is enabling the register to respond to newly applied data.

10. The apparatus defined in claim 6 wherein the input signals of each module include a first input signal which can be data stored in the register of the module, a second input signal which can be one place of a count interval value, a third input signal which can be a carry in signal from a module performing a less significant place of counting, and a fourth input signal, and wherein said signal selection circuitry selects the fourth input signal of said one of said modules as said source.

11. The apparatus defined in claim 10 wherein the input signals of each module further include a fifth input signal, and wherein the function controlled by said register-control signal is loading the register with the fifth input signal.

12. A programmable logic array integrated circuit comprising:

a plurality of modules of programmable logic, each of said modules being programmable to produce any of a plurality of logical functions of a plurality of input signals applied to the module to produce a main output signal and, depending on the logical function, a carry out signal, the input signals of each module including a carry in signal which is generally the carry out signal of a preceding module in a carry chain; and feedback circuitry associated with a predetermined one of said modules which can be a first module in a carry chain for applying the main output signal of said module to the carry in input of said module.

13. The apparatus defined in claim 12 wherein said feedback circuitry comprises:

a programmable selector for applying either the main output signal of said predetermined one of said modules or the carry out signal of another one of said modules to said carry in input of said predetermined one of said modules.

* * * * *